United States Patent
Liao et al.

(10) Patent No.: US 12,399,405 B1
(45) Date of Patent: Aug. 26, 2025

(54) PIXEL STRUCTURE

(71) Applicant: AUO Corporation, Hsinchu (TW)

(72) Inventors: Hung-Chia Liao, Hsinchu (TW); Chia-Jung Wu, Hsinchu (TW); Yueh-Chi Wu, Hsinchu (TW); Ti-Kuei Yu, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/801,859

(22) Filed: Aug. 13, 2024

(30) Foreign Application Priority Data

Feb. 22, 2024 (TW) .................... 113106440

(51) Int. Cl.
*G02F 1/1362* (2006.01)
*G02F 1/13357* (2006.01)
*G02F 1/1339* (2006.01)
*H01L 25/16* (2023.01)
*H10D 86/40* (2025.01)
*H10D 86/60* (2025.01)

(52) U.S. Cl.
CPC .. *G02F 1/136209* (2013.01); *G02F 1/133603* (2013.01); *G02F 1/1339* (2013.01); *H01L 25/167* (2013.01); *H10D 86/441* (2025.01); *H10D 86/60* (2025.01)

(58) Field of Classification Search
CPC ......... G02F 1/136209; G02F 1/133603; G02F 1/1339; H10D 86/441; H10D 86/60; H01L 25/167
See application file for complete search history.

(56) References Cited

U.S. PATENT DOCUMENTS

| 2022/0082891 | A1* | 3/2022 | Adachi | G02F 1/133377 |
| 2023/0061983 | A1* | 3/2023 | Jeong | H10D 86/423 |
| 2023/0086999 | A1* | 3/2023 | Su | H10D 86/0221 |
| | | | | 345/204 |
| 2023/0189580 | A1* | 6/2023 | Kim | H10K 59/126 |
| | | | | 257/71 |
| 2024/0222463 | A1* | 7/2024 | Yeon | H10D 30/6734 |

FOREIGN PATENT DOCUMENTS

| CN | 105044964 | 11/2015 |
| CN | 107884991 | 4/2018 |
| CN | 116189551 | 5/2023 |
| CN | 114488616 | 12/2023 |

* cited by examiner

*Primary Examiner* — Kevin Quarterman
(74) *Attorney, Agent, or Firm* — JCIPRNET

(57) ABSTRACT

A display panel includes a first substrate, a second substrate, light-emitting elements, a gate driving structure and light-shielding traces. The second substrate is disposed opposite to the first substrate. An active area, a first peripheral area and a second peripheral area of the first substrate overlap an active area, a first peripheral area and a second peripheral area of the second substrate respectively. The light-emitting elements are disposed on the first peripheral area and the second peripheral area of the first substrate, or the light-emitting elements are disposed on the first peripheral area and the second peripheral area of the second substrate. The gate driving structure is disposed on the first peripheral area of the second substrate. The gate driving structure includes a device layer and a light-shielding pattern overlapped with the device layer. The light-shielding traces are disposed on the second peripheral area of the second substrate.

12 Claims, 12 Drawing Sheets

PIXEL STRUCTURE

CROSS-REFERENCE TO RELATED APPLICATION

This application claims the priority benefit of Taiwan application serial no. 113106440, filed on Feb. 22, 2024. The entirety of the above-mentioned patent application is hereby incorporated by reference herein and made a part of this specification.

BACKGROUND

Technical Field

The disclosure relates to a display panel.

Description of Related Art

In order to meet the needs of users for displaying various shared information and comprehensive information in a large area, spliced display apparatus with multiple display panels have been widely used in various fields. For example, spliced display apparatus are commonly used in public information display areas (such as large advertisements, monitoring and management screens, etc.). However, spliced display apparatus usually has the problem of discontinuity in the overall display screen, which affects the viewing quality.

SUMMARY

This disclosure provides a display panel with good optical performance.

The display panel of an embodiment of this disclosure includes a first substrate, a second substrate, light-emitting elements, a gate driving structure and light-shielding traces. The first substrate has an active area, a first peripheral area and a second peripheral area, wherein the first peripheral area is located between the active area and the second peripheral area. The second substrate is disposed opposite the first substrate and has an active area, a first peripheral area and a second peripheral area. The active area, the first peripheral area and the second peripheral area of the first substrate respectively overlap the active area, the first peripheral area and the second peripheral area of the second substrate. The light-emitting elements are disposed on the first peripheral area and the second peripheral area of the first substrate, or the light-emitting elements are disposed on the first peripheral area and the second peripheral area of the second substrate. The gate driving structure is disposed on the first peripheral area of the second substrate. The gate driving structure includes a device layer and a light-shielding pattern overlapping the device layer. The light-shielding traces are disposed on the second peripheral area of the second substrate. In a unit area, a ratio of an area occupied by the light-shielding pattern of the gate driving structure to an area of the unit area is a first ratio. In the unit area, a ratio of an area occupied by the light-shielding traces to the area of the unit area is the second ratio. Specially, an absolute value of a difference between the first ratio and the second ratio is less than or equal to 5%.

The display panel of an embodiment of this disclosure includes a first substrate, a second substrate, light-emitting elements, a gate driving structure and light-shielding traces. The first substrate has an active area, a first peripheral area and a second peripheral area, wherein the first peripheral area is located between the active area and the second peripheral area. The second substrate is disposed opposite the first substrate and has an active area, a first peripheral area and a second peripheral area. The active area, the first peripheral area and the second peripheral area of the first substrate respectively overlap the active area, the first peripheral area and the second peripheral area of the second substrate. The light-emitting elements are disposed on the first peripheral area and the second peripheral area of the first substrate, or the light-emitting elements are disposed on the first peripheral area and the second peripheral area of the second substrate. The gate driving structure is disposed on the first peripheral area of the second substrate. The gate driving structure includes a device layer and a light-shielding pattern overlapping the device layer. The light-shielding traces are disposed on the second peripheral area of the second substrate. In a unit area, a ratio of an area occupied by the light-shielding pattern of the gate driving structure to an area of the unit area is a first ratio. In the unit area, a ratio of an area occupied by the light-shielding traces to the area of the unit area is the second ratio. The first ratio is greater than the second ratio. The light-emitting elements includes a first part and a second part. The first part of the light-emitting elements overlaps the light-shielding pattern of the gate driving structure. The second portion of the light-emitting elements overlaps with the light-shielding traces. Specially, a driving current of the first part of the light-emitting elements is greater than a driving current of the second part of the light-emitting elements.

The display panel of an embodiment of this disclosure includes a first substrate, a second substrate, light-emitting elements, a gate driving structure and light-shielding traces. The first substrate has an active area, a first peripheral area and a second peripheral area, wherein the first peripheral area is located between the active area and the second peripheral area. The second substrate is disposed opposite the first substrate and has an active area, a first peripheral area and a second peripheral area. The active area, the first peripheral area and the second peripheral area of the first substrate respectively overlap the active area, the first peripheral area and the second peripheral area of the second substrate. The light-emitting elements are disposed on the first peripheral area and the second peripheral area of the first substrate, or the light-emitting elements are disposed on the first peripheral area and the second peripheral area of the second substrate. The gate driving structure is disposed on the first peripheral area of the second substrate. The gate driving structure includes a device layer and a light-shielding pattern overlapping the device layer. The light-shielding traces are disposed on the second peripheral area of the second substrate. In a unit area, a ratio of an area occupied by the light-shielding pattern of the gate driving structure to an area of the unit area is a first ratio. In the unit area, a ratio of an area occupied by the light-shielding traces to the area of the unit area is the second ratio. The first ratio is greater than the second ratio. The light-emitting elements includes a first part and a second part. The first part of the light-emitting elements overlaps the light-shielding pattern of the gate driving structure. The second portion of the light-emitting elements overlaps with the light-shielding traces. Specially, a luminous efficiency of the first part of the light-emitting elements is greater than a luminous efficiency of the second part of the light-emitting elements.

DESCRIPTION OF THE EMBODIMENTS

Figure 1:
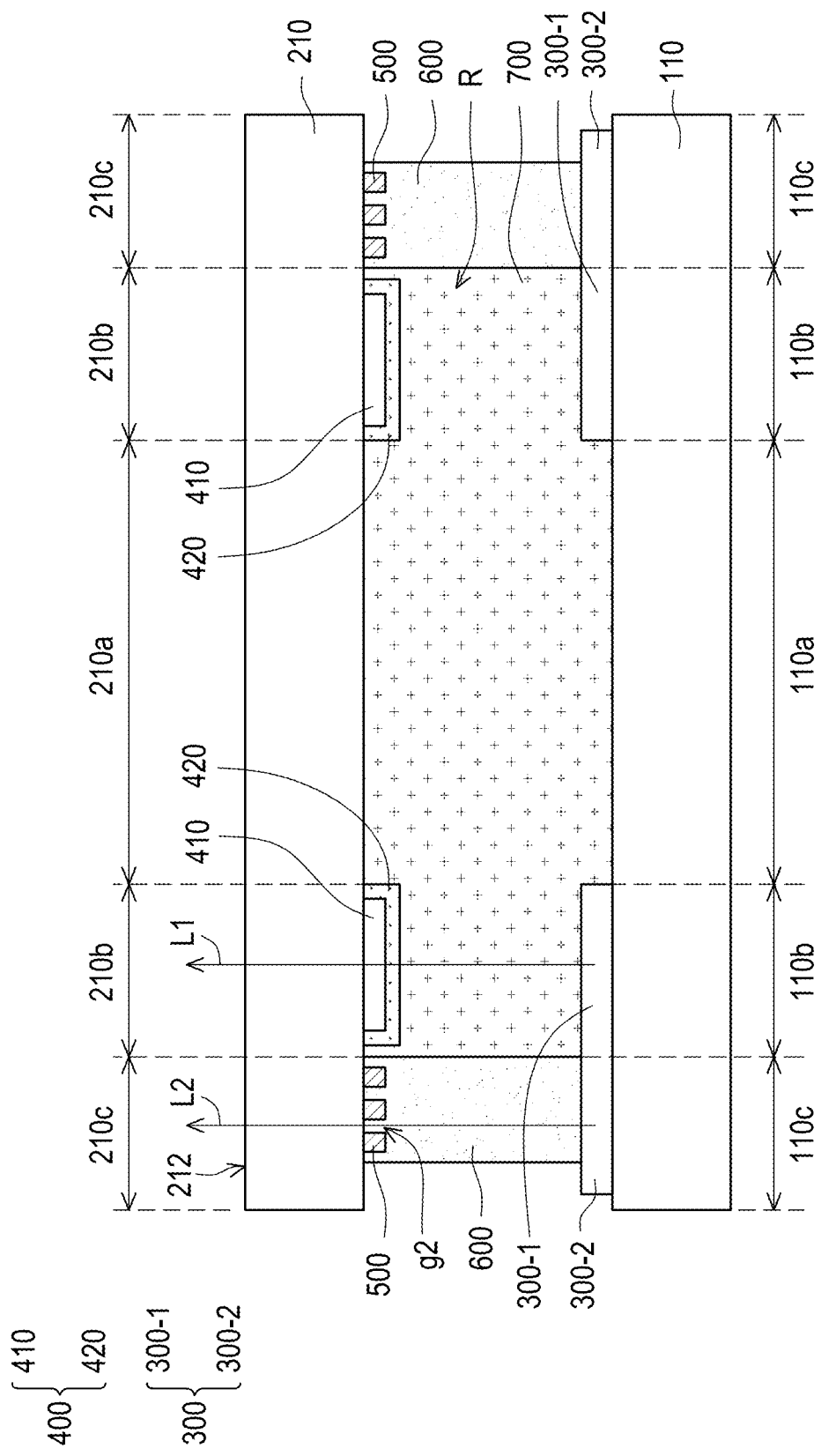
FIG. 1 is a schematic cross-sectional view of a display panel according to an embodiment of this disclosure.

Reference will now be made in detail to exemplary embodiments provided in the disclosure, examples of which are illustrated in accompanying drawings. Wherever possible, identical reference numerals are used in the drawings and descriptions to refer to identical or similar parts.

It should be understood that when a device such as a layer, film, region or substrate is referred to as being "on" or "connected to" another device, it may be directly on or connected to another device, or intervening devices may also be present. In contrast, when a device is referred to as being "directly on" or "directly connected to" another device, there are no intervening devices present. As used herein, the term "connected" may refer to physical connection and/or electrical connection. Besides, if two devices are "electrically connected" or "coupled", it is possible that other devices are present between these two devices.

The term "about," "approximately," or "substantially" as used herein is inclusive of the stated value and a mean within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations, for example, ±30%, ±20%, ±10%, or ±5% of the stated value. Moreover, a relatively acceptable range of deviation or standard deviation may be chosen for the term "about," "approximately," or "substantially" as used herein based on optical properties, etching properties or other properties, instead of applying one standard deviation across all the properties.

Unless otherwise defined, all terms (including technical and scientific terms) used herein have the same meaning as commonly understood by people of ordinary skill in the art. It will be further understood that terms, such as those defined in the commonly used dictionaries, should be interpreted as having a meaning that is consistent with their meaning in the context of the relevant art and the invention and will not be interpreted in an idealized or overly formal sense unless expressly so defined herein.

Figure 2:
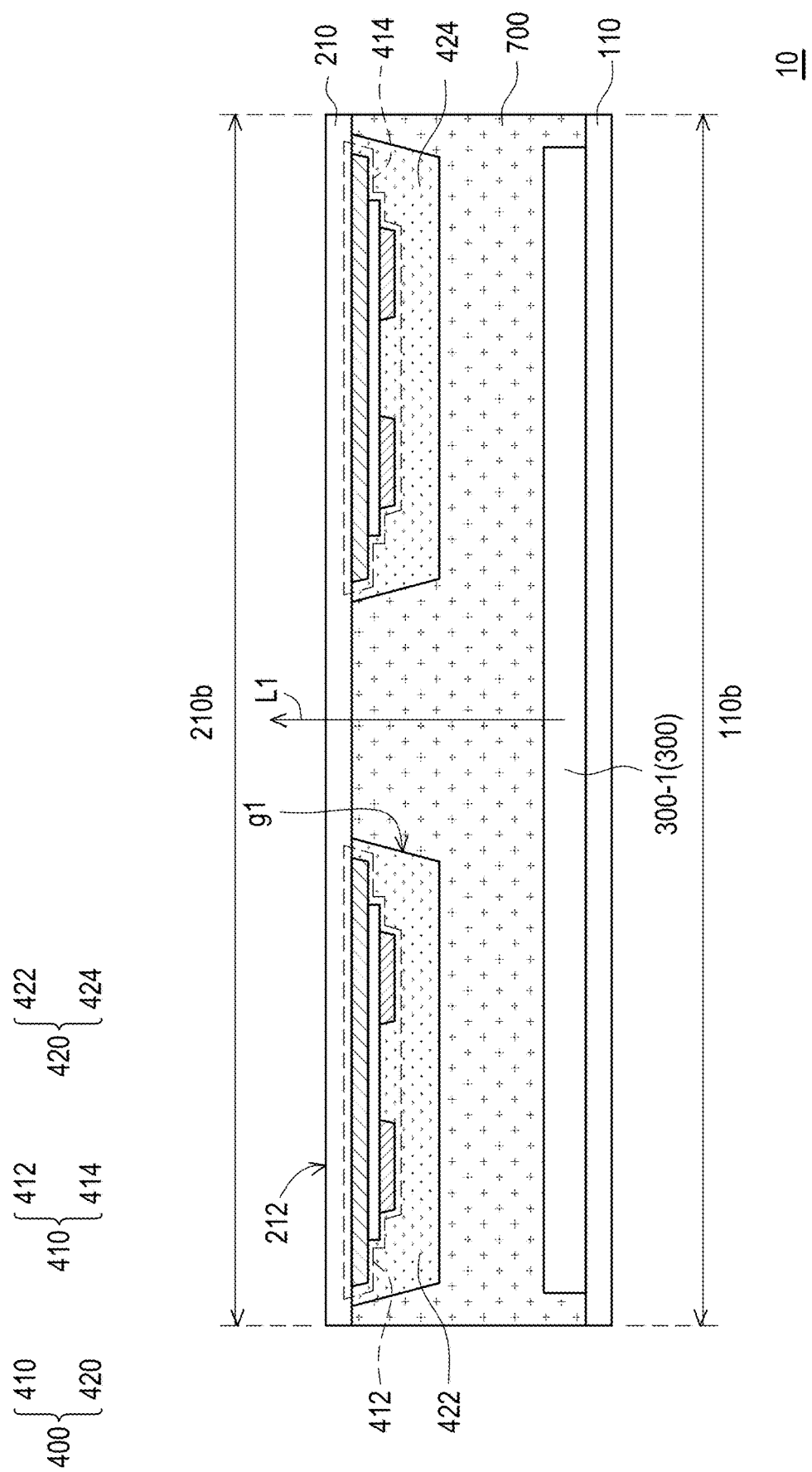
FIG. 2 is a cross-sectional and enlarged schematic diagram of the first peripheral area of the display panel according to an embodiment of the present disclosure.
Figure 3:
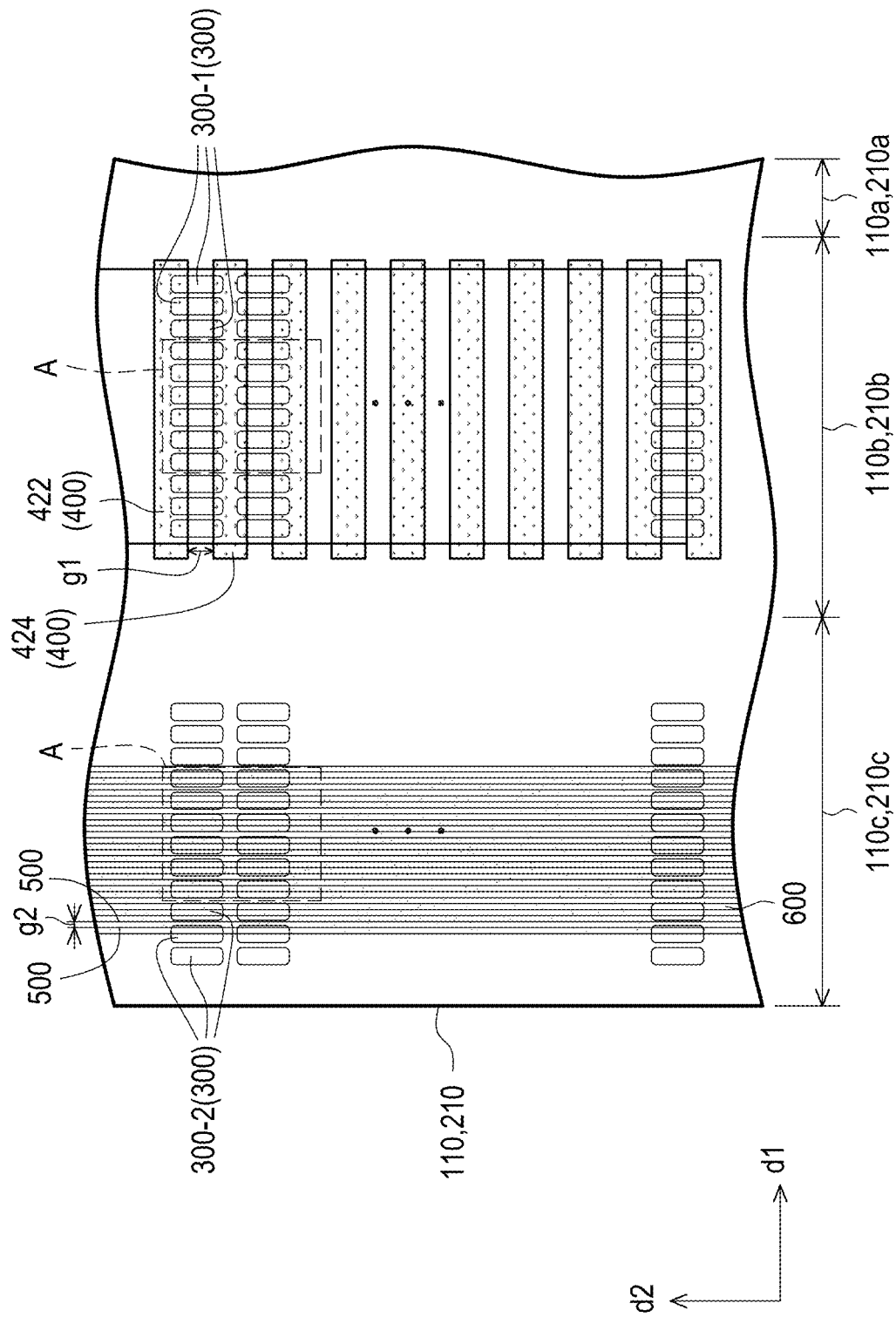
FIG. 3 is a top view and perspective view of the first substrate, light-emitting elements, sealant, light-shielding traces, gate driving structure and second substrate of the display panel according to an embodiment of this disclosure.

FIG. 1 is a schematic cross-sectional view of a display panel according to an embodiment of this disclosure. FIG. 2 is a cross-sectional and enlarged schematic diagram of the first peripheral area of the display panel according to an embodiment of the present disclosure. FIG. 3 is a top view and perspective view of the first substrate, light-emitting elements, sealant, light-shielding traces, gate driving structure and second substrate of the display panel according to an embodiment of this disclosure. It should be noted that FIG. 1 and FIG. 2 schematically represent the light-emitting elements 300 of FIG. 3 with a continuous pattern. That is to say, the positions marked 300 in FIG. 1 and FIG. 2 may represent light-emitting elements 300. In addition, the positions marked 300-1/300-2 in FIG. 1 and FIG. 2 may represent one or more light-emitting elements 300.

Referring to FIG. 1, FIG. 2 and FIG. 3, the display panel 10 includes a first substrate 110. The first substrate 110 has an active area 110a, a first peripheral area 110b and a second peripheral area 110c, wherein the first peripheral area 110b is located between the active area 110a and the second peripheral area 110c. For example, in one embodiment, the first substrate 110 may be a color filter substrate, wherein the color filter substrate may include a black matrix (not shown) and color filter patterns (not shown) disposed on the active area 110a, the black matrix has pixel openings respectively overlapping pixel electrodes (not shown), and the color filter patterns are respectively disposed in the pixel openings of the black matrix.

The display panel 10 further includes a second substrate 210 disposed opposite to the first substrate 110. The second substrate 210 is disposed opposite the first substrate 110 and has an active area 210a, a first peripheral area 210b and a second peripheral area 210c. The active area 110a, first peripheral area 110b and second peripheral area 110c of the first substrate 110 overlap with the active area 210a, first peripheral area 210b and second peripheral area 210c of the second substrate 210 respectively. For example, in one embodiment, the second substrate 210 may be a pixel array substrate, wherein the pixel array substrate includes a substrate (not shown), pixel structures (not shown) disposed on the substrate (not shown), data lines (not shown) and gate lines (not shown), and the pixel structures are disposed in the active area 210a. Each of the pixel structures may include a pixel transistor (not shown) and a pixel electrode (not shown), first terminals of pixel transistors of the pixel structures are electrically connected to the data lines, and control terminals of the pixel transistors of the pixel structures are electrically connected to the gate lines, and second terminals of the pixel transistors of the pixel structures are electrically connected to pixel electrodes of the pixel structures.

The display panel 10 further includes light-emitting elements 300. The light-emitting elements 300 are disposed on the first peripheral area 110b and the second peripheral area 110c of the first substrate 110, or the light-emitting elements 300 are disposed on the first peripheral area 210b and the second peripheral area 210c of the second substrate 210. For example, in one embodiment, the light-emitting elements 300 may be selectively disposed on the first peripheral area 110b and the second peripheral area 110c of the first substrate 110, but this disclosure is not limited to thereto. The second substrate 210 has a light-emitting surface 212 facing away from the first substrate 110, and light beams L1 and L2 emitted by the light-emitting elements 300 are emitted from the light-emitting surface 212. In other words, the surface of the second substrate 210 facing away from the first substrate 110 may be a display surface facing the user. In one embodiment, the light-emitting element 300 is, for example, a micro light-emitting diode (μLED), but this disclosure is not limited to thereto.

The display panel 10 further includes a gate driving structure 400 disposed on the first peripheral area 210b of the second substrate 210. The gate driving structure 400 includes a device layer 410 and a light-shielding pattern 420 overlapping the device layer 410. In one embodiment, the device layer 410 includes a gate driving circuit, and the gate driving circuit is electrically connected to the plurality of gate lines (not shown) of the second substrate 210. In one embodiment, the gate driving circuit may include components that are electrically susceptible to illumination (such as, but not limited to, thin film transistors). The light-shielding pattern 420 may be a light-shielding insulating pattern. In one embodiment, the light-shielding pattern 420 may be fabricated using a yellow light process, but this disclosure is not limited to thereto. In one embodiment, the material of the light-shielding pattern 420 is, for example, a photoresist material, but this disclosure is not limited to thereto.

In one embodiment, the device layer 410 of the gate driving structure 400 may be disposed between the second substrate 210 and the light-shielding pattern 420 of the gate driving structure 400. In one embodiment, the device layer 410 of the gate driving structure 400 may include a first portion 412 and a second portion 414, and the light-shielding pattern 420 of the gate driving structure 400 may include a first portion 422 and a second portion 424. The first portion 422 and the second portion 424 of the light-shielding pattern 420 respectively overlap the first portion 412 and the second portion 414 of the layer 410, and the first portion 422 and the second portion 424 of the light-shielding pattern 420 are spaced apart from each other, and there is a gap g1 between the first portion 422 and the second portion 424 of the light-shielding pattern 420. The light beam L1 emitted by the light-emitting elements 300 can pass through the gap g1 between the first portion 422 and the second portion 424 of the light-shielding pattern 420 of the gate driving structure 400, and then emerge from the light-emitting surface 212 of the second substrate 210. In one embodiment, the light-emitting elements 300 may overlap the first portion 422 of the light-shielding pattern 420, the second portion 424 of the light-shielding pattern 420, and the gap g1 between the first portion 422 and the second portion 424 of the light-shielding pattern 420.

The display panel 10 further includes light-shielding traces 500 disposed on the second peripheral area 210c of the second substrate 210. In one embodiment, the light-shielding traces 500 are separated from each other, and there is gap g2 between two adjacent light-shielding traces 500.

The light beams L2 emitted by the light-emitting elements 300 can pass through the gap g2 between the light-shielding traces 500 and then emerge from the light-emitting surface 212 of the second substrate 210. In one embodiment, the light-shielding traces 500 may be electrically connected to the pixel structures (not shown) of the second substrate 210, but this disclosure is not limited to thereto. In one embodiment, the light-shielding traces 500 may be metal traces, but this disclosure is not limited to thereto.

The display pane 110 further includes a sealant 600 and a display medium 700. The sealant 600 is located between the second peripheral area 110c of the first substrate 110 and the second peripheral area 210c of the second substrate 210. The display medium 700 is disposed in an accommodation space R surrounded by the sealant 600, the first substrate 110 and the second substrate 210. In one embodiment, the display medium 700 is, for example, liquid crystal, but this disclosure is not limited to thereto.

In one embodiment, the first part 300-1 of the light-emitting elements 300 disposed on the first peripheral area 110b of the first substrate 110 may overlap with the light-shielding pattern 420 of the gate driving structure 400, and the second part 300-2 of the light-emitting elements 300 disposed on the second peripheral area 110c of the first substrate 110 may overlap the sealant 600 and the light-shielding traces 500.

The light beam L1 emitted by the first part 300-1 of the light-emitting elements 300 can pass through the gap g1 inside the gate driving structure 400, and then be emitted from the first peripheral area 210b of the second substrate 210. The light beam L2 emitted by the second part 300-2 of the light-emitting elements 300 can pass through the gap g2 between the light-shielding traces 500, and then be emitted from the second peripheral area 210c of the second substrate 210. Thereby, when display panels 10 are spliced together to form a spliced display device (not shown) with a large display screen, the light beams L1 and L2 from the first peripheral area 210b and the second peripheral area 210c of each of the display panels 10 can eliminate the above mentioned splicing seams of the large display screen.

In addition, since the gate driving structure 400 has the light-shielding pattern 420, when the light-emitting element 300 disposed on the first substrate 110 emits light beams L1 and L2 toward the second substrate 210, the device layer 410 of the gate driving structure 400 disposed on the second substrate 210 is not easily affected by the light beams L1 and L2, so that the spliced display device composed of the display panels 10 can have both excellent optical and electrical performance.

Moreover, it is worth noting that in one embodiment, in a unit area A, a ratio of an area occupied by the light-shielding pattern 420 of the gate driving structure 400 to an area of the unit area A is a first ratio; in the same unit area A, a ratio of an area occupied by the light-shielding traces 500 to the area of the unit area A is the second ratio; an absolute value of a difference between the first ratio and the second ratio is less than or equal to 5%. In other words, through the layout design of the gate driving structure 400, the gate driving structure 400 disposed on the first peripheral area 210b may have gap g1 and a certain degree of light transmittance, and by adjusting the layout of the gate driving structure 400, an overall transmittance of the display panel 10 at the first peripheral area 210b is the same as or similar to a transmittance of the display panel 10 at the second peripheral area 210c, thereby matching the brightness of the first peripheral area 210 b and the second peripheral area 210c of the display panel 10. In this way, the visual effect of eliminating seams of the light-emitting element 300 can be further improved. For example, in one embodiment, a difference between the overall transmittance of the display panel 10 at the first peripheral area 210b and the overall transmittance of the display panel 10 at the second peripheral area 210c may be less than or equal to 3%, but this disclosure is not limited to thereto.

In one embodiment, the first part 300-1 of the light-emitting elements 300 may be located between the display medium 700 and the first substrate 110, and the display medium 700 may be located between the light-shielding pattern 420 of the gate driving structure 400 and the first part of the light-emitting elements 300. The light-shielding pattern 420 of the gate driving structure 400 may be located between the device layer 410 of the gate driving structure 400 and the display medium 700. The device layer 410 of the gate driving structure 400 may be located between the second substrate 210 and the light-shielding pattern 420 of the gate driving structure 400. The second part 300-2 of the light-emitting elements 300 may be located between the sealant 600 and the first substrate 110, the sealant 600 may be located between the second part 300-2 of the light-emitting elements 300 and the light-shielding traces 500, and the light-shielding traces 500 may be located between the second substrate 210 and sealant 600, but this disclosure is not limited to thereto.

In the following embodiment, the reference numerals and part of the description of the foregoing embodiment are applied, where the same reference numerals are used to indicate the same or similar components, and descriptions of the same technical contents are omitted. Reference may be made to the foregoing embodiment for the omitted descriptions, which will not be repeated in following embodiment.

Figure 4:
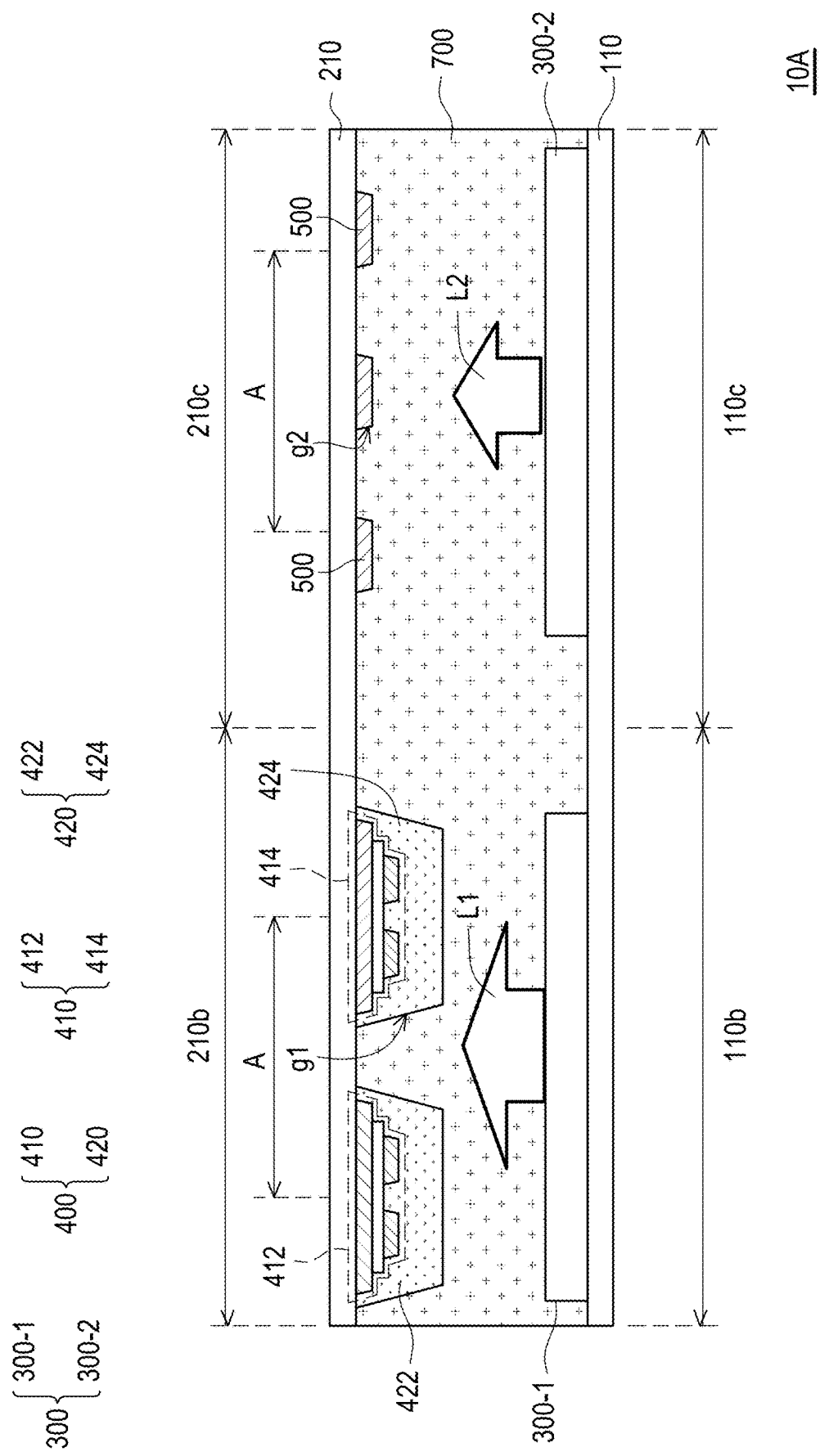
FIG. 4 is a cross-sectional and enlarged schematic diagram of the first peripheral area of the display panel of another embodiment of the present disclosure.

FIG. 4 is a cross-sectional and enlarged schematic diagram of the first peripheral area of the display panel of another embodiment of the present disclosure. The positions marked 300-1/300-2 in FIG. 4 may represent one or more light-emitting elements 300.

The display panel 10A of FIG. 4 is similar to the aforementioned display panel 10. The difference between the two is that the two same unit areas A are located in the first peripheral area 210b and the second peripheral area 210c of the display panel 10A respectively; in the unit area A, a ratio of an area occupied by the light-shielding pattern 420 of the gate driving structure 400 to an area of the unit area A is a first ratio; in the same unit area A, a ratio of an area occupied by the light-shielding traces 500 to the area of the unit area A is a second ratio; the first ratio is greater than the second ratio. In other words, the light-transmitting area of the first peripheral area 210b where the gate driving structure 400 is located is smaller than the light-transmitting area of the second peripheral area 210c where the multiple light-shielding traces 500 are located.

Referring to FIG. 4, in this embodiment, the light-emitting elements 300 includes a first part 300-1 and a second part 300-2. The first part 300-1 of the plurality of light-emitting elements 300 overlaps the light-shielding pattern 420 of the gate driving structure 400, the second part 300-2 of the light-emitting elements 300 overlaps the light-shielding traces 500, and the driving currents of the first part 300-1 of the light-emitting elements 300 are greater than the driving currents of the second part 300-2 of the light-emitting elements 300. In one embodiment, the first parts 300-1 of the light-emitting elements 300 and the second part 300-2 of the light-emitting elements 300 may be selectively located in different rows.

Figure 5:
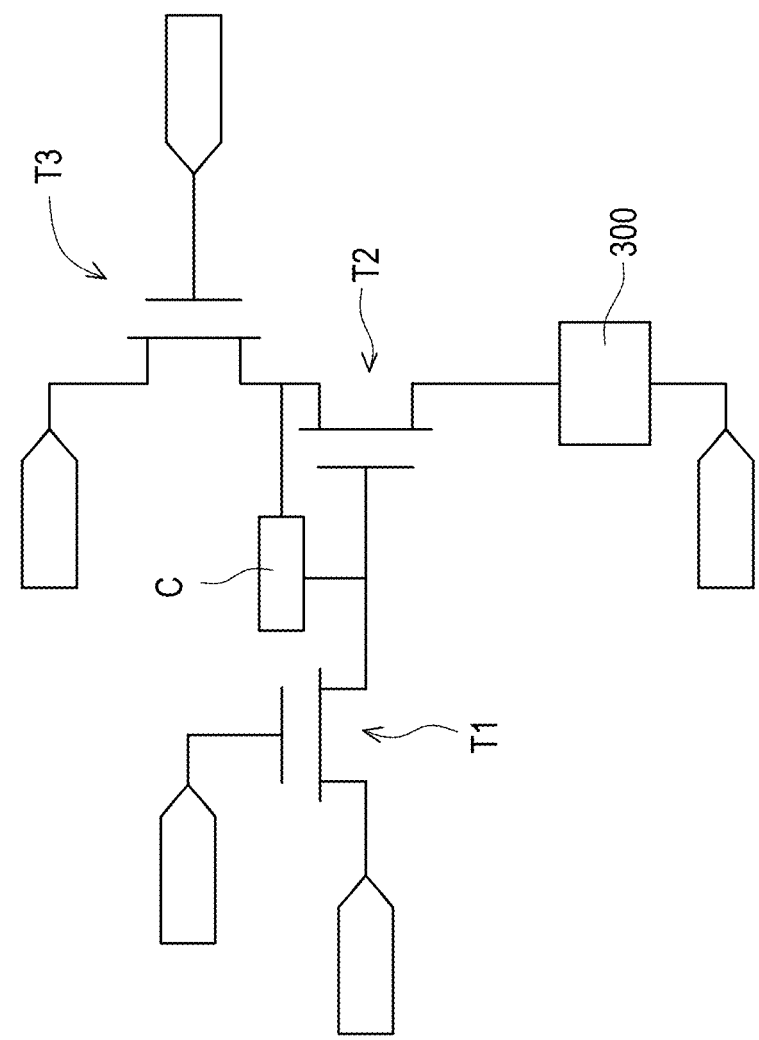
FIG. 5 shows a light-emitting element and a driving circuit of the light-emitting element of a display panel according to another embodiment of this disclosure.

FIG. 5 shows a light-emitting element and a driving circuit of the light-emitting element of a display panel according to another embodiment of this disclosure. Referring to FIG. 4 and FIG. 5, for example, in one embodiment, the driving circuit D300 of each of the light-emitting element 300 may include three thin film transistors T1, T2, and T3 and a capacitor C shown in FIG. 5. In one embodiment, the channel aspect ratio of the thin film transistor T2 of the driving circuit D300 electrically connected to the first part 300-1 of the light-emitting elements 300 may be equal to the channel aspect ratio of the thin-film transistor T2 of the driving circuit D300 electrically connected to the second part 300-2 of the light-emitting elements 300. Thereby, the driving current of the first part 300-1 of the light-emitting elements 300 can be greater than the driving current of the second part 300-2 of the light-emitting elements 300. However, this disclosure is not limited to thereto. In other embodiments, other methods may also be used to make the driving current of the first part 300-1 of the light-emitting elements 300 greater than the driving current of the second part 300-2 of the light-emitting elements 300-2.

In this embodiment, although the light transmission area of the first peripheral area 210b where the gate driving structure 400 is located is smaller than the light transmission area of the second peripheral area 210c where the multiple light-shielding traces 500 are located, since the driving current of the first part 300-1 of the light-emitting elements 300 is greater than the driving current of the second part 300-2 of the light-emitting elements 300 (that is, the light intensity of the light beam L1 emitted by the first part 300-1 of the light-emitting elements 300 is greater than the light intensity of the light beam L2 emitted by the second part 300-2 of the light-emitting elements 300), so the brightness of the first peripheral area 210b and the second peripheral area 210c of panel 10A can be matched. In this way, the visual effect of eliminating the splicing seams of the light-emitting elements 300 located in the first peripheral area 110b and the second peripheral area 110c can be improved.

Figure 6:
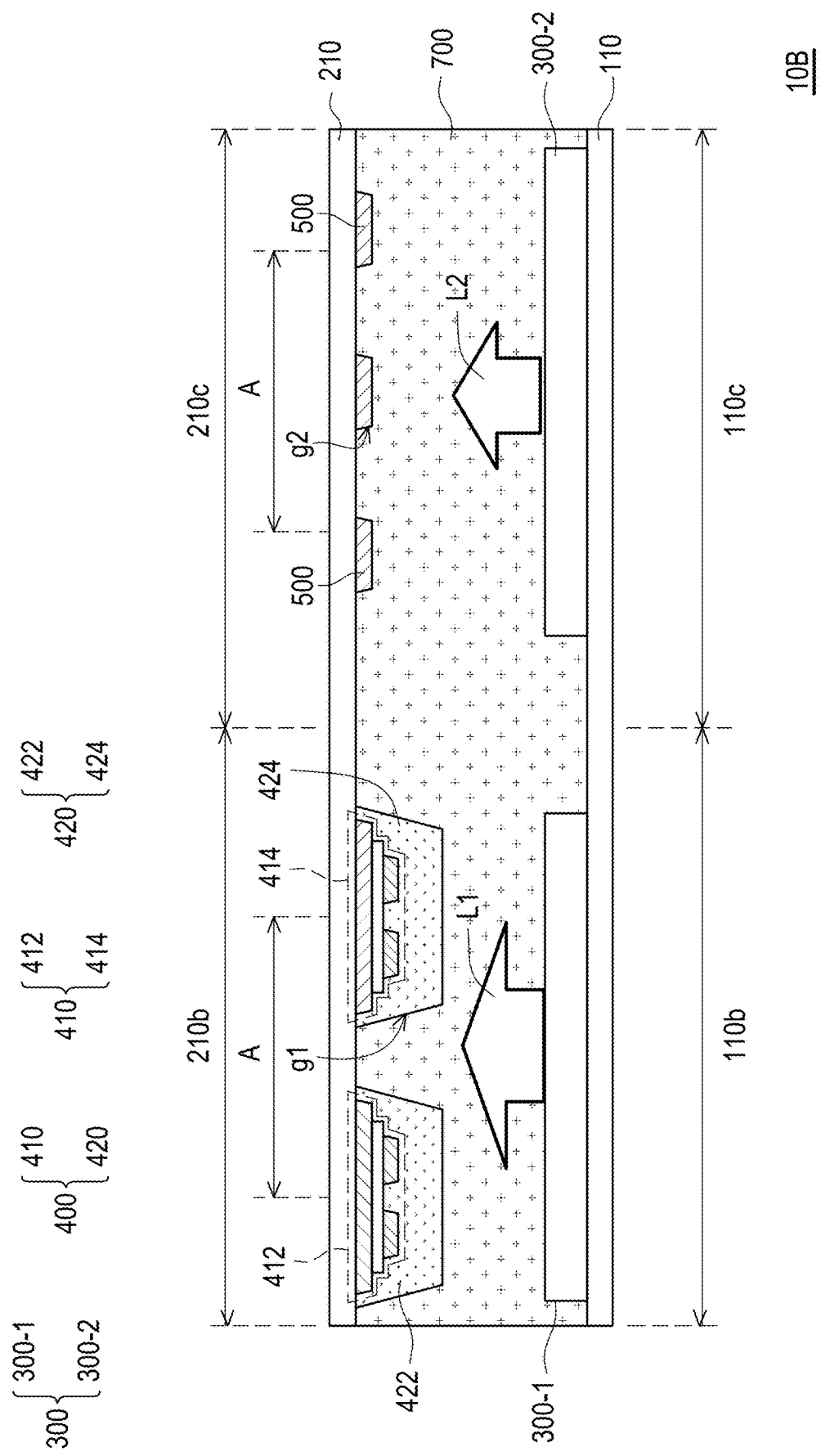
FIG. 6 is a cross-section and enlarged schematic diagram of the first peripheral area of the display panel according to another embodiment of the present disclosure.

FIG. 6 is a cross-section and enlarged schematic diagram of the first peripheral area of the display panel according to another embodiment of the present disclosure. The positions marked 300-1/300-2 in FIG. 6 may represent one or more light-emitting elements 300. The display panel 10B of FIG. 6 is similar to the display panel 10A of FIG. 4. The difference between the two is that in the embodiment of FIG. 6, the luminous efficiency of the first part 300-1 of the light-emitting elements 300 is greater than the luminous efficiency of the second part 300-1 of the light-emitting elements 300. In one embodiment, the first part 300-1 of the light-emitting elements 300 and the second part 300-2 of the light-emitting elements 300 may be selectively located in different rows.

In this embodiment, although the light transmission area of the first peripheral area 210b where the gate driving structure 400 is located is smaller than the light transmission area of the second peripheral area 210c where the multiple light-shielding traces 500 are located, since the luminous efficiency of the first part 300-1 of the light-emitting elements 300 is greater than the luminous efficiency of the second part 300-2 of the light-emitting elements 300 (that is, the light intensity of the light beam L1 emitted by the first part 300-1 of the light-emitting elements 300 is greater than the light intensity of the light beam L2 emitted by the second part 300-2 of the light-emitting elements 30), so the brightness of the first peripheral area 210b and the second peripheral area 210c of the display panel 10B can be matched. In this way, the visual effect of eliminating the splicing seams of the light-emitting elements 300 located in the first peripheral area 110b and the second peripheral area 110c can be improved.

Figure 7:
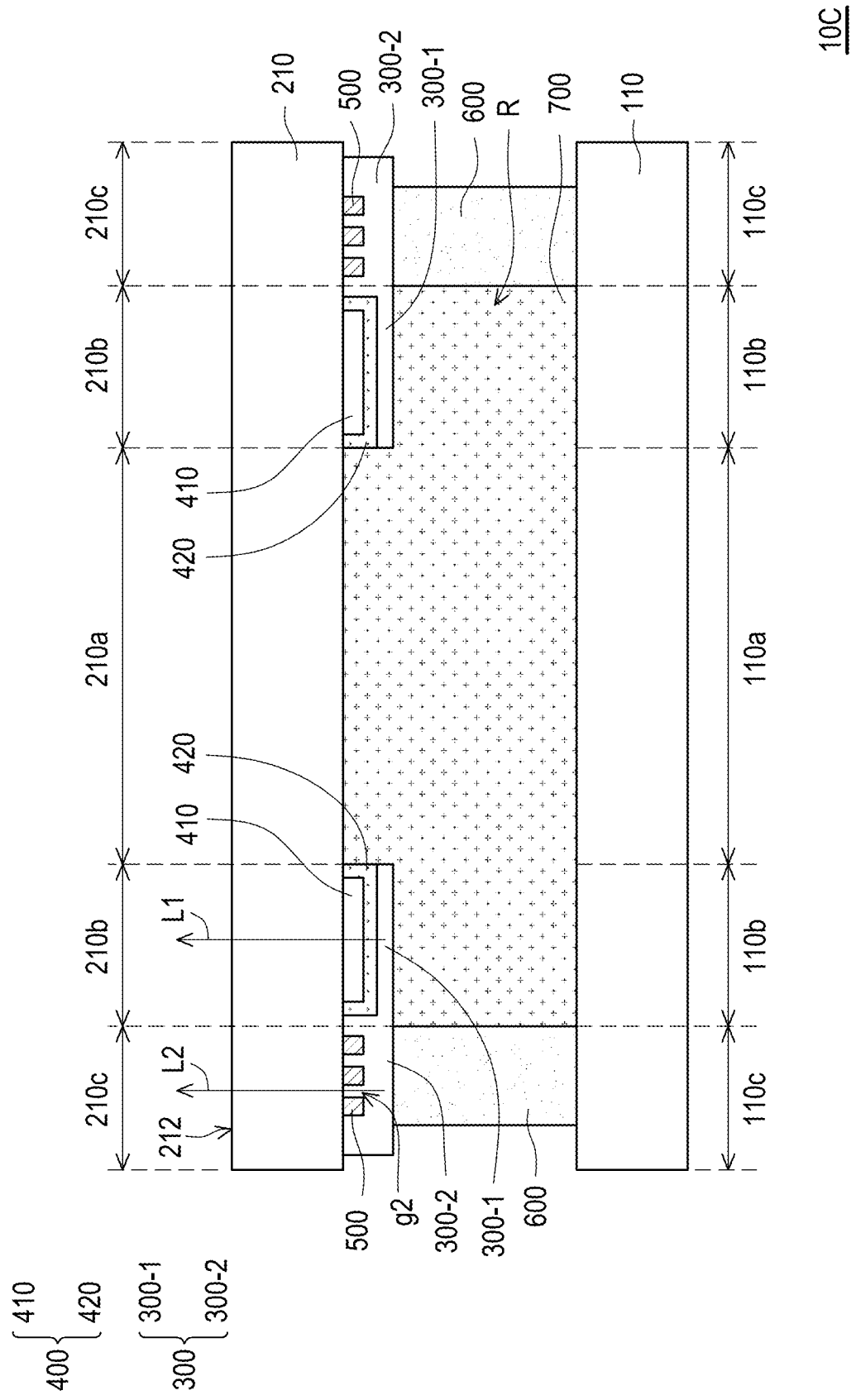
FIG. 7 is a cross-sectional and enlarged schematic diagram of the first peripheral area of the display panel according to yet another embodiment of the present disclosure.
Figure 8:
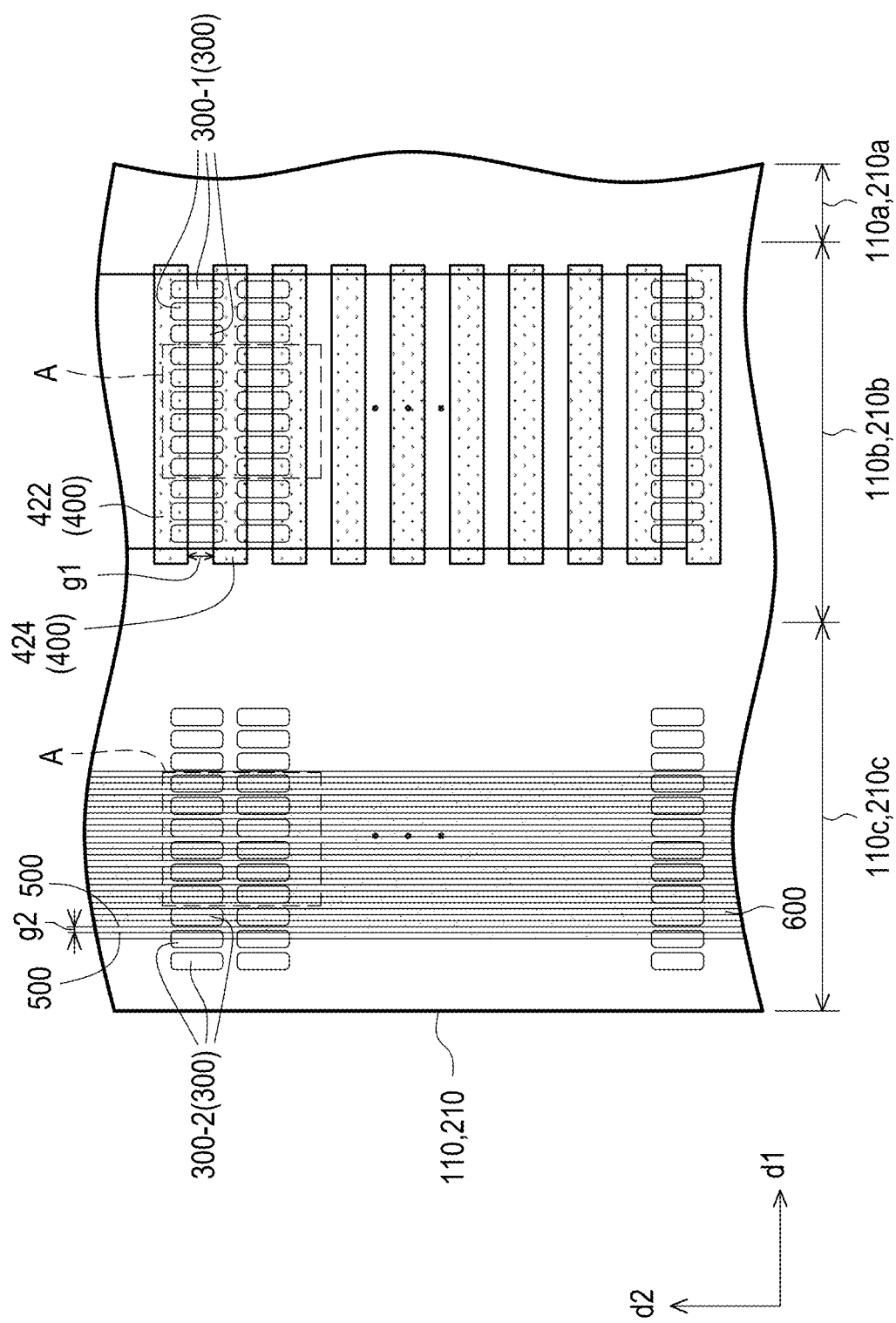
FIG. 8 is a top view and perspective view of the first substrate, the light-emitting elements, the sealant, the light-shielding traces, the gate driving structure and the second substrate of the display panel according to yet another embodiment of this disclosure.

FIG. 7 is a cross-sectional and enlarged schematic diagram of the first peripheral area of the display panel according to yet another embodiment of the present disclosure. FIG. 8 is a top view and perspective view of the first substrate, the light-emitting elements, the sealant, the light-shielding traces, the gate driving structure and the second substrate of the display panel according to yet another embodiment of this disclosure. The positions marked 300-1/300-2 in FIG. 7 may represent one or more light-emitting elements 300. The display panel 10C of FIG. 7 and FIG. 8 is similar to the aforementioned display panel 10. The difference between the two is that in the embodiments of FIG. 7 and FIG. 8, the light-emitting elements 300 are disposed on the second substrate 210.

Referring to FIG. 7 and FIG. 8, specifically, in this embodiment, the device layer 410 of the gate driving structure 400 is located between the second substrate 210 and the light-shielding pattern 420 of the gate driving structure 400. The light-shielding pattern 420 of the gate driving structure 400 is located between the device layer 410 of the structure 400 and the first part 300-1 of the light-emitting elements 300. The first portion 300-1 of the light-emitting elements 300 is located between the light-shielding pattern 420 of the gate driving structure 400 and the display medium 700. The display medium 700 is located between the first part 300-1 of the light-emitting elements 300 and the first substrate 110. The second portion 300-2 of the light-emitting elements 300 is located between the second substrate 210 and the sealant 600, and the sealant 600 is located between the second part 300-2 of the light-emitting elements 300 and the first substrate 110.

Figure 9:
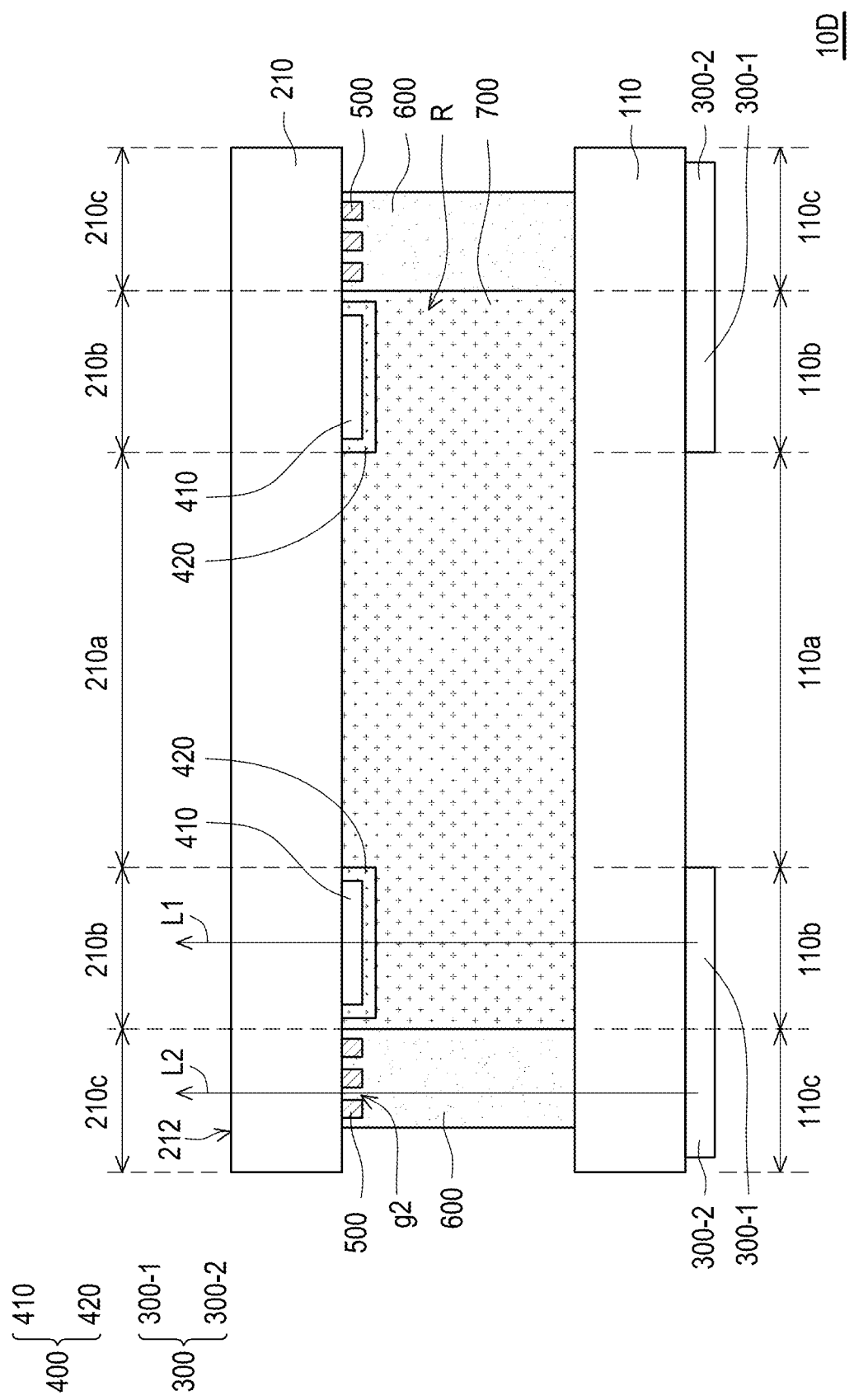
FIG. 9 is a cross-sectional and enlarged schematic diagram of the first peripheral area of the display panel according to an embodiment of the present disclosure.
Figure 10:
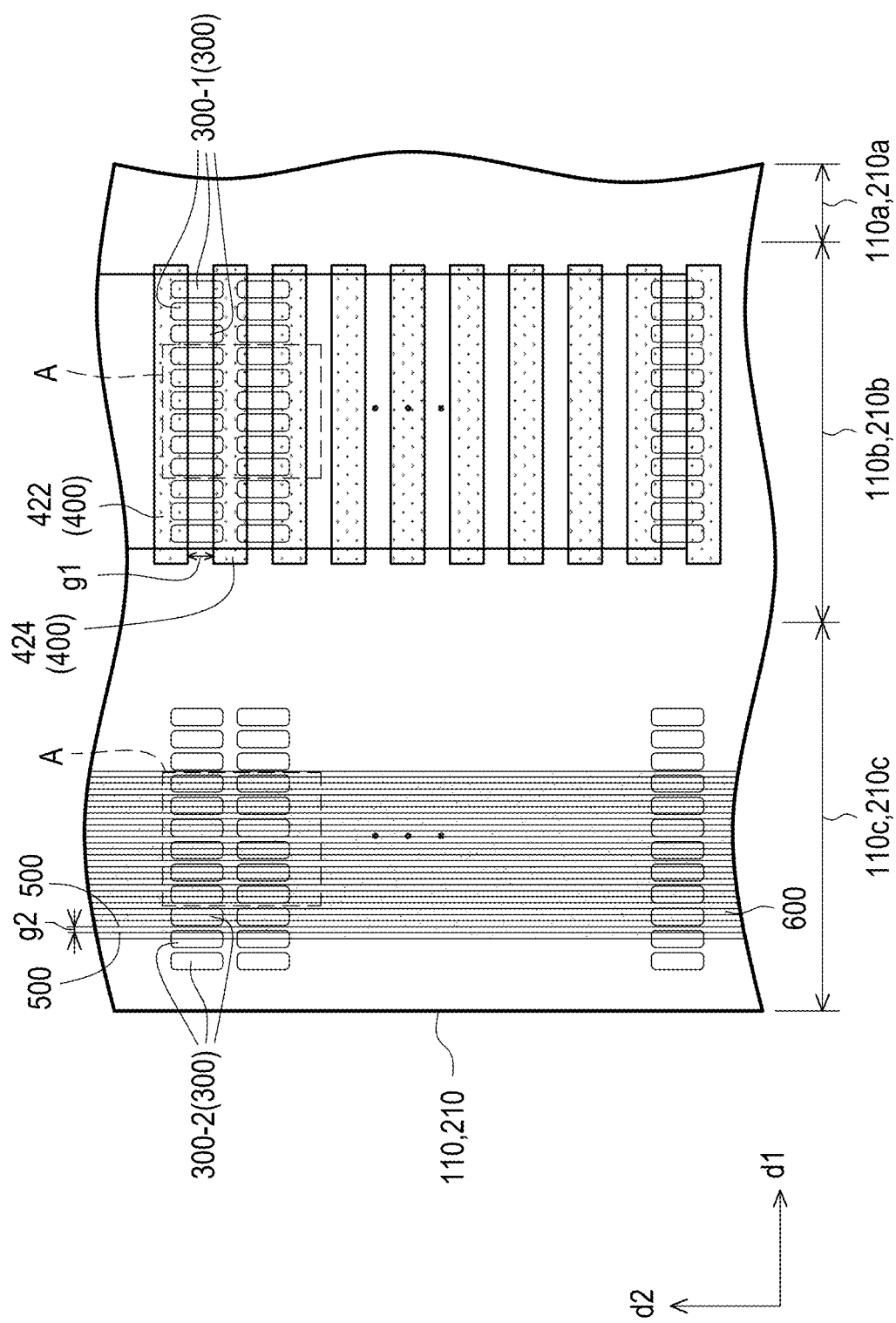
FIG. 10 is a top view and perspective view of the first substrate, the light-emitting elements, the sealant, the light-shielding traces, the gate driving structure and the second substrate of the display panel according to an embodiment of this disclosure.

FIG. 9 is a cross-sectional and enlarged schematic diagram of the first peripheral area of the display panel according to an embodiment of the present disclosure. FIG. 10 is a top view and perspective view of the first substrate, the light-emitting elements, the sealant, the light-shielding traces, the gate driving structure and the second substrate of the display panel according to an embodiment of this disclosure. The positions marked 300-1/300-2 in FIG. 9 may represent one or more light-emitting elements 300. The display panel 10D in FIG. 9 and FIG. 10 is similar to the aforementioned display panel 10. The difference between the two is that in the embodiments of FIG. 9 and FIG. 10, the light-emitting elements 300 are disposed under the first substrate 110.

Referring to FIG. 9 and FIG. 10, specifically, in this embodiment, the device layer 410 of the gate driving structure 400 is located between the second substrate 210 and the light-shielding pattern 420 of the gate driving structure 400. The light-shielding pattern 420 of the gate driving structure 400 is located between the device layer 410 of the gate driving structure 400 and the display medium 700. The display medium 700 is located between the light-shielding pattern 420 of the gate driving structure 400 and the first substrate 110. The first substrate 110 is located between the display medium 700 and the first part 300-1 of the light-emitting elements 300, and the first substrate 110 is located between the sealant 600 and the second part 300-2 of the light-emitting elements 300.

Figure 11:
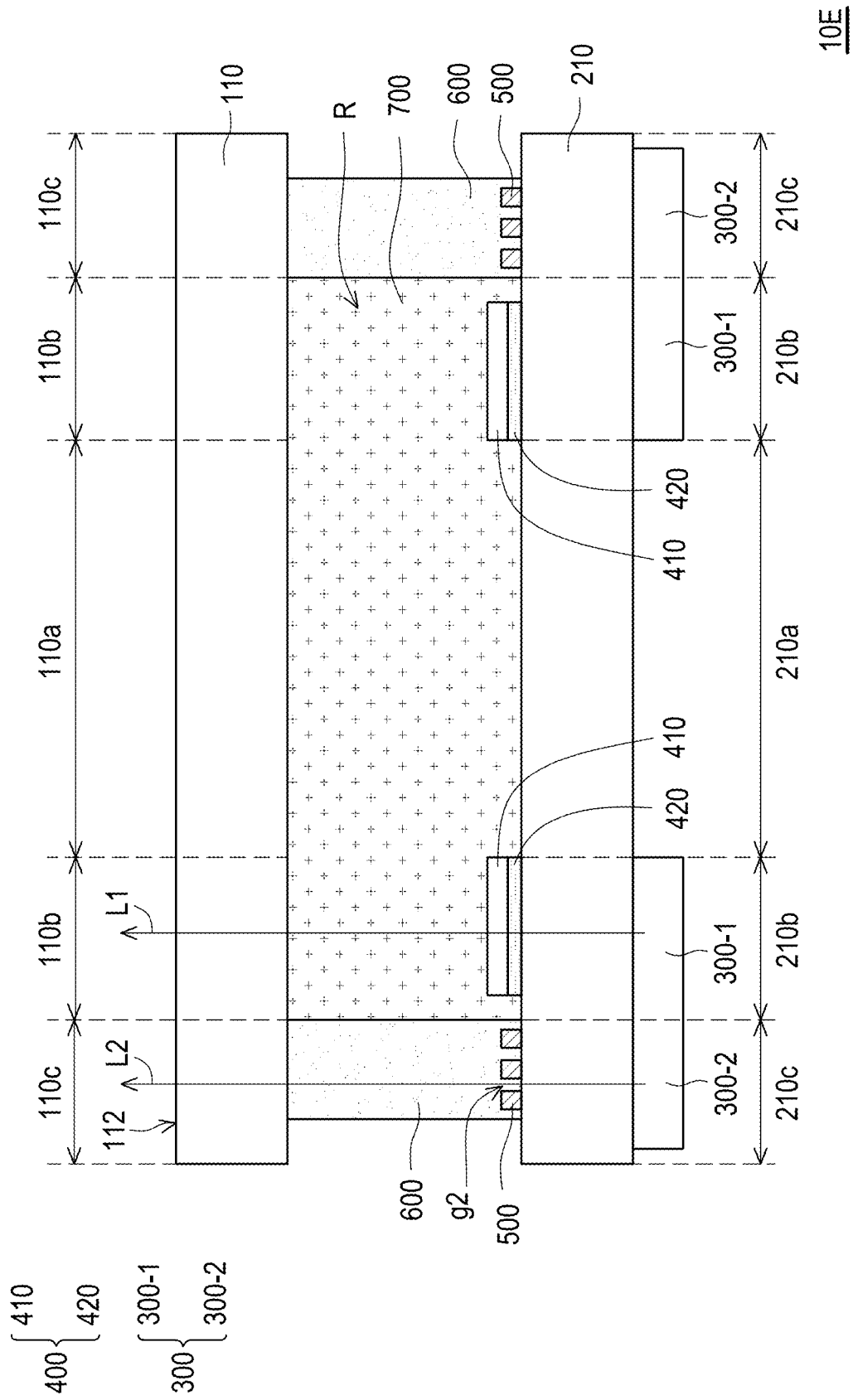
FIG. 11 is a cross-sectional and enlarged schematic diagram of the first peripheral area of the display panel according to an embodiment of the present disclosure.
Figure 12:
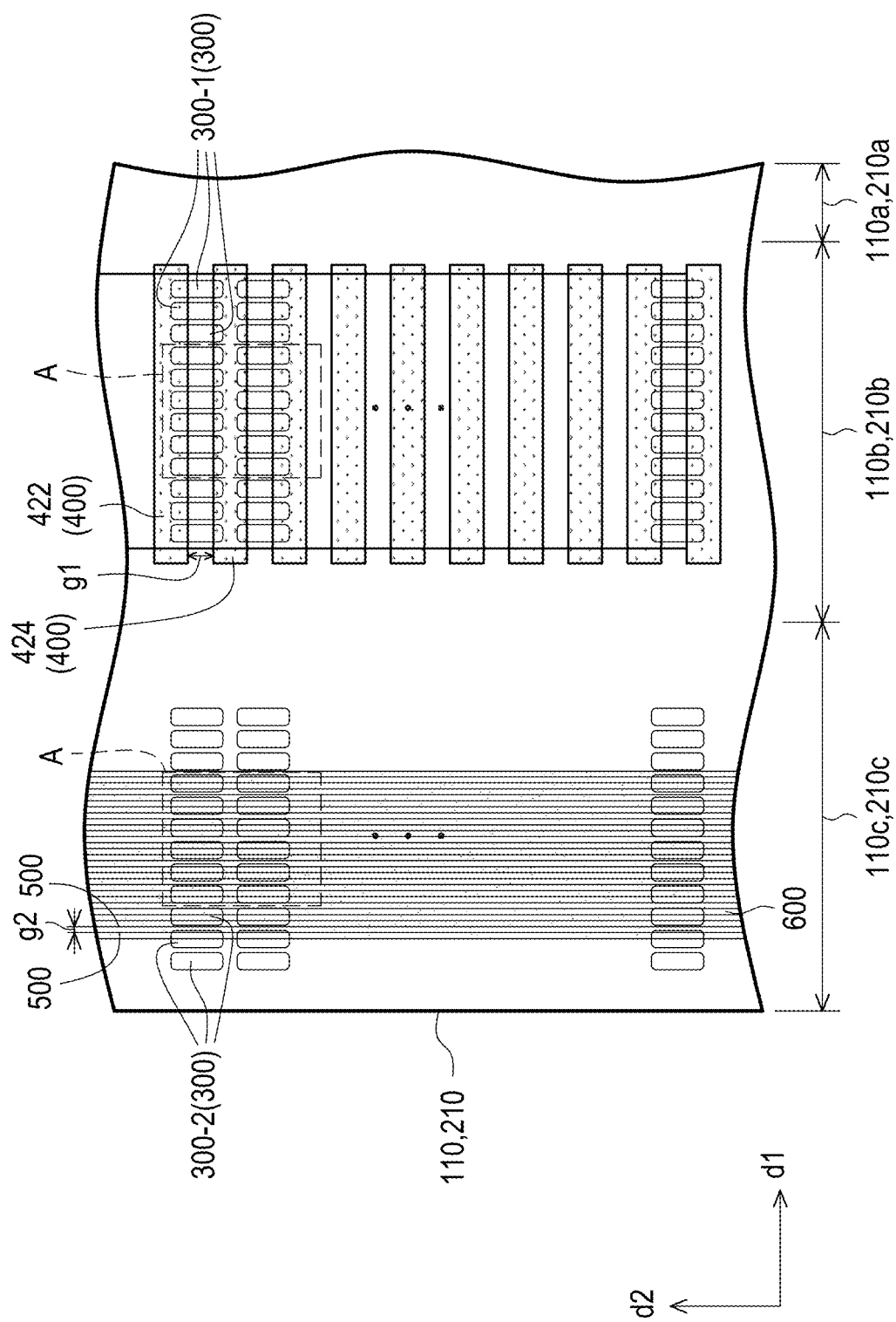
FIG. 12 is a top view and perspective view of the first substrate, the light-emitting elements, the sealant, the light-shielding traces, the gate driving structure and the second substrate of the display panel according to an embodiment of this disclosure.

FIG. 11 is a cross-sectional and enlarged schematic diagram of the first peripheral area of the display panel according to an embodiment of the present disclosure. FIG. 12 is a top view and perspective view of the first substrate, the light-emitting elements, the sealant, the light-shielding traces, the gate driving structure and the second substrate of the display panel according to an embodiment of this disclosure. The positions marked 300-1/300-2 in FIG. 11 may represent one or more light-emitting elements 300. The display panel 10E of FIG. 11 and FIG. 12 is similar to the aforementioned display panel 10. The difference between the two is that in the embodiment of FIG. 11 and FIG. 12, the first substrate 110 is on the top, the second substrate 210 is on the bottom, and the light-emitting elements 300 are disposed under the second substrate 210, the first substrate 110 has a light-emitting surface 112 facing away from the second substrate 210, and the light beams L1 and L2 emitted by the light-emitting elements 300 are emitted from the light-emitting surface 112.

Referring to FIG. 11 and FIG. 12, specifically, in this embodiment, the second substrate 210 is located between the light-shielding pattern 420 of the gate driving structure 400 and the first part 300-1 of the plurality of light-emitting elements 300. The light-shielding pattern 420 of the gate driving structure 400 is located between the device layer 410 of the gate driving structure 400 and the second substrate 210. The device layer 410 of the gate driving structure 400 is located between the display medium 700 and the light-shielding pattern 420 of the gate driving structure 400. The display medium 700 is located between the first substrate 110 and the device layer 410 of the gate driving structure 400, and the second substrate 210 is located between the sealant 600 and the second portion 300-2 of the light-emitting elements 300.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A display panel comprising:
   a first substrate, having an active area, a first peripheral area and a second peripheral area, wherein the first peripheral area is located between the active area and the second peripheral area;
   a second substrate disposed opposite the first substrate and having an active area, a first peripheral area and a second peripheral area, wherein the active area, the first peripheral area and the second peripheral area of the first substrate respectively overlap the active area, the first peripheral area and the second peripheral area of the second substrate;
   a plurality of light-emitting elements, wherein the light-emitting elements are disposed on the first peripheral area and the second peripheral area of the first substrate, or the light-emitting elements are disposed on the first peripheral area and the second peripheral area of the second substrate;
   a gate driving structure disposed on the first peripheral area of the second substrate, wherein the gate driving structure comprises a device layer and a light-shielding pattern overlapping the device layer; and
   a plurality of light-shielding traces disposed on the second peripheral area of the second substrate;
   in a unit area, a ratio of an area occupied by the light-shielding pattern of the gate driving structure to an area of the unit area is a first ratio; in the unit area, a ratio of an area occupied by the light-shielding traces to the area of the unit area is a second ratio; an absolute value of a difference between the first ratio and the second ratio is less than or equal to 5%.

2. The display panel according to claim 1, wherein the device layer of the gate driving structure is disposed between the second substrate and the light-shielding pattern of the gate driving structure.

3. The display panel according to claim 1, wherein the device layer of the gate driving structure comprises a first portion and a second portion, the light-shielding pattern of the gate driving structure comprises a first portion and a second portion, and the first portion and the second portion of the light-shielding pattern respectively overlap the first portion and the second portion of the device layer and are separated from each other, and there is a gap between the first portion and the second portion of the light-shielding pattern.

4. The display panel according to claim 3, wherein the light-emitting elements overlap the first portion of the light-shielding pattern, the second portion of the light-shielding pattern, and the gap between the first portion and the second portion of the light-shielding pattern.

5. The display panel according to claim 1, further comprising:
a sealant, located between the second peripheral area of the first substrate and the second peripheral area of the second substrate;
wherein a first part of the light-emitting elements disposed on the first peripheral area of the first substrate is overlapped with the light-shielding pattern of the gate driving structure, and a second part of the light-emitting elements disposed on the second peripheral area of the first substrate is overlapped with the sealant and the light-shielding traces.

6. The display panel according to claim 5, further comprising:
a display medium, disposed in an accommodation space surrounded by the sealant, the first substrate and the second substrate;
wherein the first part of the light-emitting elements is located between the display medium and the first substrate, and the display medium is located between the light-shielding pattern of the gate driving structure and the first part of the light-emitting elements, the light-shielding pattern of the gate driving structure is located between the device layer of the gate driving structure and the display medium, the device layer of the gate driving structure is located between the second substrate and the light-shielding pattern of the gate driving structure, the second part of the light-emitting elements is located between the sealant and the first substrate, the sealant is located between the second part of the light-emitting elements and the light-shielding traces, and the light-shielding traces is located between the second substrate and the sealant.

7. The display panel according to claim 5, further comprising:
a display medium, wherein the sealant, the first substrate and the second substrate enclose an accommodation space, and the display medium is disposed in the accommodation space;
wherein the device layer of the gate driving structure is located between the second substrate and the light-shielding pattern of the gate driving structure, the light-shielding pattern of the gate driving structure is located between the device layer of the gate driving structure and the first part of the light-emitting elements, the first part of the light-emitting elements is located between the light-shielding pattern of the gate driving structure and the display medium, the display medium is located between the first part of the light-emitting elements and the first substrate, the second part of the light-emitting elements is located between the second substrate and the sealant, and the sealant is located between the second part of the light-emitting elements and the first substrate.

8. The display panel according to claim 5, further comprising:
a display medium, wherein the sealant, the first substrate and the second substrate enclose an accommodation space, and the display medium is disposed in the accommodation space;
wherein the device layer of the gate driving structure is located between the second substrate and the light-shielding pattern of the gate driving structure, the light-shielding pattern of the gate driving structure is located between the device layer of the gate driving structure and the display between medium, the display medium is located between the light-shielding pattern of the gate driving structure and the first substrate, the first substrate is located between the display medium and the first part of the light-emitting elements, and the first substrate is located between the sealant the second part of the light-emitting elements.

9. The display panel according to claim 5, further comprising:
a display medium, wherein the sealant, the first substrate and the second substrate enclose an accommodation space, and the display medium is disposed in the accommodation space;
wherein the second substrate is located between the light-shielding pattern of the gate driving structure and the first part of the light-emitting elements, the light-shielding pattern of the gate driving structure is located between the device layer of the gate driving structure and the second substrate, the device layer of the gate driving structure is located between the display medium and the light-shielding pattern of the gate driving structure, the display medium is located between the first substrate and the device layer of the gate driving structure, and the second substrate is located between the sealant and the second part of the light-emitting elements.

10. The display panel according to claim 1, wherein a difference between an overall transmittance of the display panel at the first peripheral area of the second substrate and an overall transmittance of the display panel at the second peripheral area of the second substrate is less than or equal to 3%.

11. A display panel comprising:
a first substrate, having an active area, a first peripheral area and a second peripheral area, wherein the first peripheral area is located between the active area and the second peripheral area;
a second substrate disposed opposite the first substrate and having an active area, a first peripheral area and a second peripheral area, wherein the active area, the first peripheral area and the second peripheral area of the first substrate respectively overlap the active area, the first peripheral area and the second peripheral area of the second substrate;
a plurality of light-emitting elements, wherein the light-emitting elements are disposed on the first peripheral area and the second peripheral area of the first substrate, or the light-emitting elements are disposed on the first peripheral area and the second peripheral area of the second substrate;
a gate driving structure disposed on the first peripheral area of the second substrate, wherein the gate driving structure comprises a device layer and a light-shielding pattern covering the device layer; and
a plurality of light-shielding traces disposed on the second peripheral area of the second substrate;
in a unit area, a ratio of an area occupied by the light-shielding pattern of the gate driving structure to an area of the unit area is a first ratio; in the unit area, a ratio of an area occupied by the light-shielding traces to the area of the unit area is a second ratio; the first ratio is greater than the second ratio;
the light-emitting elements comprises a first part and a second part, the first part of the light-emitting elements overlaps the light-shielding pattern of the gate driving structure, the second part of the light-emitting elements overlaps with the light-shielding traces, and a driving current of the first part of the light-emitting elements is greater than a driving current of the second part of the light-emitting elements.

12. A display panel comprising:
a first substrate, having an active area, a first peripheral area and a second peripheral area, wherein the first peripheral area is located between the active area and the second peripheral area;
a second substrate disposed opposite the first substrate and having an active area, a first peripheral area and a second peripheral area, wherein the active area, the first peripheral area and the second peripheral area of the first substrate respectively overlap the active area, the first peripheral area and the second peripheral area of the second substrate;
a plurality of light-emitting elements, wherein the light-emitting elements are disposed on the first peripheral area and the second peripheral area of the first substrate, or the light-emitting elements are disposed on the first peripheral area and the second peripheral area of the second substrate;
a gate driving structure disposed on the first peripheral area of the second substrate, wherein the gate driving structure comprises a device layer and a light-shielding pattern covering the device layer; and
a plurality of light-shielding traces disposed on the second peripheral area of the second substrate;
in a unit area, a ratio of an area occupied by the light-shielding pattern of the gate driving structure to an area of the unit area is a first ratio; in the unit area, a ratio of an area occupied by the light-shielding traces to the area of the unit area is a second ratio; the first ratio is greater than the second ratio;
the light-emitting elements comprises a first part and a second part, the first part of the light-emitting elements overlaps the light-shielding pattern of the gate driving structure, the second part of the light-emitting elements overlaps with the light-shielding traces, and a luminous efficiency of the first part of the light-emitting elements is greater than a luminous efficiency of the second part of the light-emitting elements.

\* \* \* \* \*